(12) United States Patent
Lee et al.

(10) Patent No.: US 8,581,242 B2
(45) Date of Patent: Nov. 12, 2013

(54) APPARATUS COMBINING BYPASS DIODE AND WIRE

(75) Inventors: Yueh-Mu Lee, Taoyuan County (TW); Zun-Hao Shih, Taoyuan County (TW); Hwen-Fen Hong, Taoyuan County (TW)

(73) Assignee: Atomic Energy Council—Institute of Nuclear Energy Research, Taoyuan County (TW)

( * ) Notice: Subject to any disclaimer, the term of this patent is extended or adjusted under 35 U.S.C. 154(b) by 0 days.

(21) Appl. No.: 13/400,731

(22) Filed: Feb. 21, 2012

(65) Prior Publication Data

US 2013/0214376 A1 Aug. 22, 2013

(51) Int. Cl.
*H01L 29/06* (2006.01)
*H01L 29/08* (2006.01)
*H01L 31/0352* (2006.01)

(52) U.S. Cl.
USPC .............. 257/41; 257/E21.352; 257/E27.051; 257/E27.073; 257/E29.327

(58) Field of Classification Search
USPC ............. 257/41, E21.352, E27.051, E27.073, 257/E29.327
See application file for complete search history.

(56) References Cited

U.S. PATENT DOCUMENTS

| | | | | |
|---|---|---|---|---|
| 5,616,185 A * | 4/1997 | Kukulka | ........................ | 136/244 |
| 6,113,718 A * | 9/2000 | Yamada et al. | ................... | 156/78 |
| 6,278,054 B1 * | 8/2001 | Ho et al. | ........................ | 136/256 |
| 6,452,086 B1 * | 9/2002 | Muller | ........................ | 136/244 |
| 6,617,508 B2 * | 9/2003 | Kilmer et al. | ................... | 136/252 |
| 7,723,609 B2 * | 5/2010 | Yoshikawa et al. | ........... | 136/244 |
| 2005/0133086 A1 * | 6/2005 | Itoyama et al. | ................ | 136/256 |
| 2008/0314432 A1 * | 12/2008 | Paulson et al. | ................ | 136/244 |
| 2009/0272427 A1 * | 11/2009 | Bett et al. | ........................ | 136/249 |
| 2010/0089435 A1 * | 4/2010 | Lockenhoff | .................. | 136/246 |
| 2011/0100436 A1 * | 5/2011 | Cleereman et al. | ........... | 136/251 |
| 2011/0132431 A1 * | 6/2011 | Linderman et al. | ........... | 136/246 |
| 2011/0253188 A1 * | 10/2011 | Lenox | ........................... | 136/244 |
| 2012/0012156 A1 * | 1/2012 | Linderman et al. | ........... | 136/246 |
| 2012/0161801 A1 * | 6/2012 | Hasegawa | ................ | 324/750.01 |
| 2012/0285502 A1 * | 11/2012 | Philipp | ......................... | 136/244 |

* cited by examiner

*Primary Examiner* — Ida M Soward
(74) *Attorney, Agent, or Firm* — Rosenberg, Klein & Lee

(57) ABSTRACT

The present invention relates to an apparatus combining bypass diode and wire. According to the present invention, the bypass diode can connect with the wire directly. It is not necessary to reserve an extra region on the substrate of the solar cell as the wire soldering area. Thereby, the required area of the ceramic substrate is reduced, and hence lowering the manufacturing cost of the solar cell substantially.

8 Claims, 5 Drawing Sheets

APPARATUS COMBINING BYPASS DIODE AND WIRE

FIELD OF THE INVENTION

The present invention relates generally to an apparatus, and particular to an apparatus combining bypass diode and wire.

BACKGROUND OF THE INVENTION

With rapid development of industries, fossil fuels are gradually exhausted. In addition, the greenhouse effect and the problem of gas emission attract global concerns daily. The stable supply of energy has become a major subject worldwide. In comparison with traditional coal, natural gas, or nuclear power, solar cells do not consume non-renewable resources. Instead, they convert directly solar energy into electricity by the photoelectric effect. Thereby, no greenhouse effect gases, such as carbon dioxide, nitrogen oxides, and sulfur oxides, and pollutant gases are produced. By reducing dependence on fossil fuels, a safe and autonomous power source is provided.

In a renewable power generating system, solar energy has the advantage of high environmental friendliness and ease of installation. Besides, its technology has become mature for commercialization and national programs are provided for promotion. Nowadays, it has become the major choice of advanced countries for developing distributed power system.

Nevertheless, solar cell technology still needs to be improved in many ways for enhancing its stability and lifetime or reducing its cost. Because a solar cell module is composed of many solar cells, when a single or a few solar cells is aged, damaged, sheltered by leaves or accumulated snow, or partially sheltered caused by installation orientation different from the other modules for matching the terrain or outer-wall structure of a building, the hop-spot effect occurs at the portions without illumination and hence resulting in thermal damages. This effect can severely damage solar cells. In addition, part of the energy generated by the solar cells with illumination might be dissipated by the cells without. For solving the problem, both electrodes of the output end of the solar cell assembly are connected with a bypass diode.

The function of the bypass diode is that when the solar cell appears the hot-spot effect and cannot generate power, the bypass diode can make the currents generated by the other solar cells flow thereby and thus enabling the solar cell power generating system to continue power generation. A problem occurring at a certain solar cell will not open the power generating circuit.

In the solar cell module according to the prior art, the bypass diode and the solar cell are both located on a substrate and form a circuit via a metal conducting layer. Wires are soldered on the metal conducting layer for outputting the current of the solar cell module and thus forming a complete circuit.

Nonetheless, this structure occupies a great area because in addition to the solar cell and the bypass diode, an extra region should be reserved as the wire soldering area, which forces the vendors of the solar cell power generating system to adopt a larger substrate. In other words, a portion of the larger substrate has only the function for soldering the wires and makes no significant contribution on power generation. In FIG. 1, the current flowing through the bypass diode 30 via the first pin 301 (not shown in the figure) is guided to first wire 501 passing the first metal conducting area 201. On the other hand, by contacting the second pins 302 from the side with the second metal conducting area 202, the current flowing through the second pins 302 can flow to the second wire 502 via the second metal conducting area 30. In this architecture, the metal conducting layer 20 is required for the bypass diode 30 for guiding the currents to the first wire or the second wire 501, 502. In a solar cell power generating system, each small piece of area is precious and should be reserved for power generation. Thereby, the disposal of the soldering areas is undoubtedly a design raising the cost but unbeneficial to power generation.

Accordingly, how to solve the waste brought by the wire soldering areas is an important issue of the solar cell power generation field.

SUMMARY

An objective of the present invention is to provide an apparatus combining diode and wire, which has conducting members to which the bypass diode and the wire can connect directly. Thereby, the area of the ceramic substrate required by a single solar cell can be shrunk substantially and thus reducing the manufacturing cost.

Another objective of the present invention is to provide an apparatus combining diode and wire, which provides conducting members for insetting wires and hence the wires can connect with the overall structure stably.

For achieving the objectives described above, the present invention discloses an apparatus combining diode and wire, which comprises a substrate, a metal conducting layer, a bypass diode, a first conducting member, and a second conducting member. The metal conducting layer is disposed on the substrate, and having a first metal conducting area, a second metal conducting area, and an insulating area. The insulating area separates the first and second metal conducting areas. The bypass diode is disposed above the metal conducting layer. The first conducting member and a first pin of the bypass diode stack at and combine with the first metal conducting area. The second conducting member and a second pin of the bypass diode stack at and combine with the second metal conducting area.

DETAILED DESCRIPTION

In order to make the structure and characteristics as well as the effectiveness of the present invention to be further understood and recognized, the detailed description of the present invention is provided as follows along with embodiments and accompanying figures.

In the structure of the solar cell module according to the prior art, because an extra wire soldering area needs to be reserved, the area of the adopted substrate cannot be shrunk and hence making lowering of cost not possible. For solving the problem, the present invention designs an apparatus combining bypass diode and wire for reducing the area of the substrate and hence lowering cost.

Figure 2:
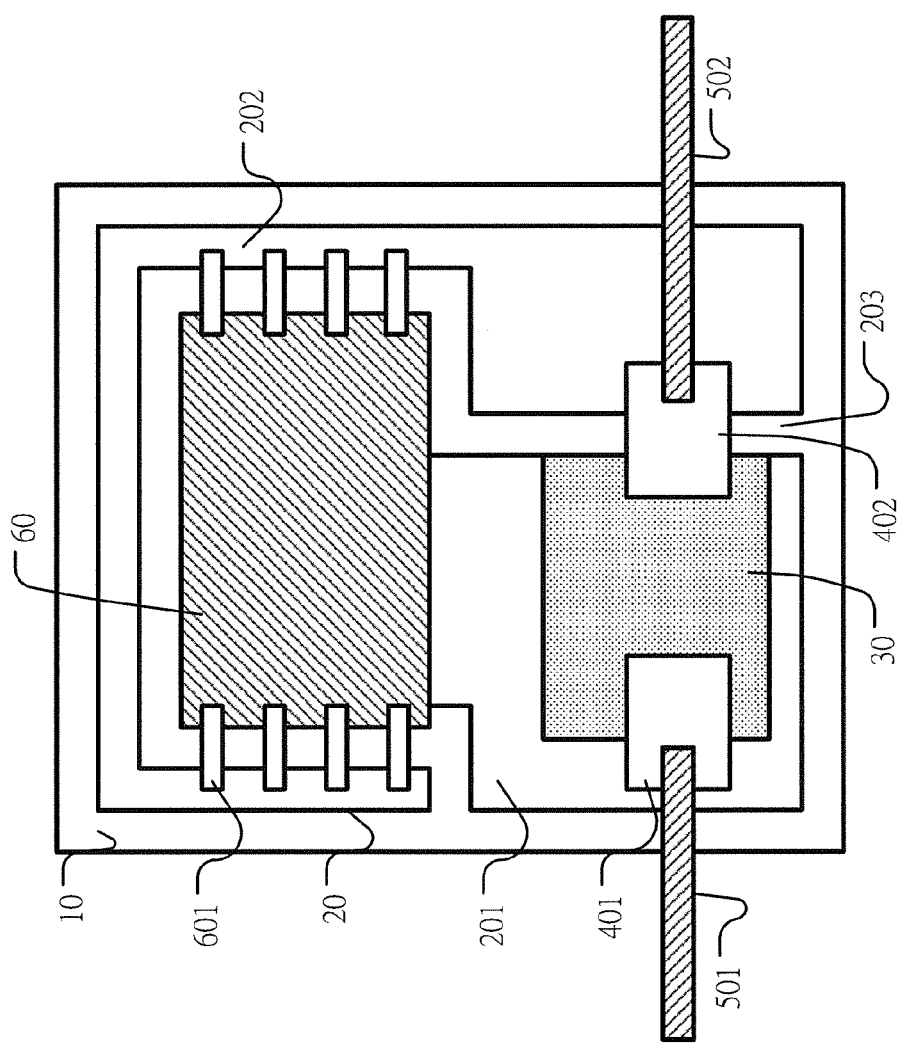
FIG. 2 shows a structural schematic diagram according to a preferred embodiment of the present invention.

First, please refer to FIG. 2. The apparatus combining bypass diode and wire according to the present invention comprise a substrate 10, a metal conducting layer 20, a first metal conducting area 201, a second metal conducting area 202, an insulating area 203, a bypass diode 30, a first pin 301 (not shown in the figure), a second pin 302 (not shown in the pin), a first conducting member 401, and a second conducting member 402.

The metal conducting layer 20 is disposed on the substrate 10, and can be divided into two electrically conducting areas including the first metal conducting area 201 and the second metal conducting area 202. The metal conducting layer 20 also includes the insulating area 203, which separating the first and second metal conducting areas 201, 202 so that there is no current flowing therebetween. The bypass diode is disposed above the metal conducting layer 20. The first conducting member 401 and the first pin 301 of the bypass diode 30 stack at and combine with the first metal conducting area 201; the second conducting member 402 and the second pin 302 of the bypass diode 30 stack at and combine with the second metal conducting area 202. Owing to the limitation of the viewing angle, the first and second pins 301, 302 will be shown in FIG. 3.

In addition to the devices described above, referring to FIG. 2 again, the apparatus combining bypass diode and wire according to the present invention further comprises at least a solar cell 60, a plurality of metal wires 601, a first wire 501, and a second wire 502. The solar cell 60 is disposed on the first metal conducting area 201, and is connected electrically with the first metal conducting area 201 via the electrodes (not shown in the figure) of the solar cell 60 itself. The plurality of metal wires 601 are connected electrically to the solar cell 60 and the second metal conducting area 202 so that the latter two can form a circuit by means of the metal wires 601. As for the first wire 501, it is connected with the first conducting member 401 for conducting the current of the first conducting member 401 to a remote end. The second wire 502 is connected with the second conducting member 402 for conducting the current of the second conducting member 402 to a remote end.

The present invention is characterized in that the first and second conducting members 401, 402 can lead currents into or out of the bypass diode 30 directly without the need of using the metal conducting layer 20 as an electrically conducting medium.

Figure 1:
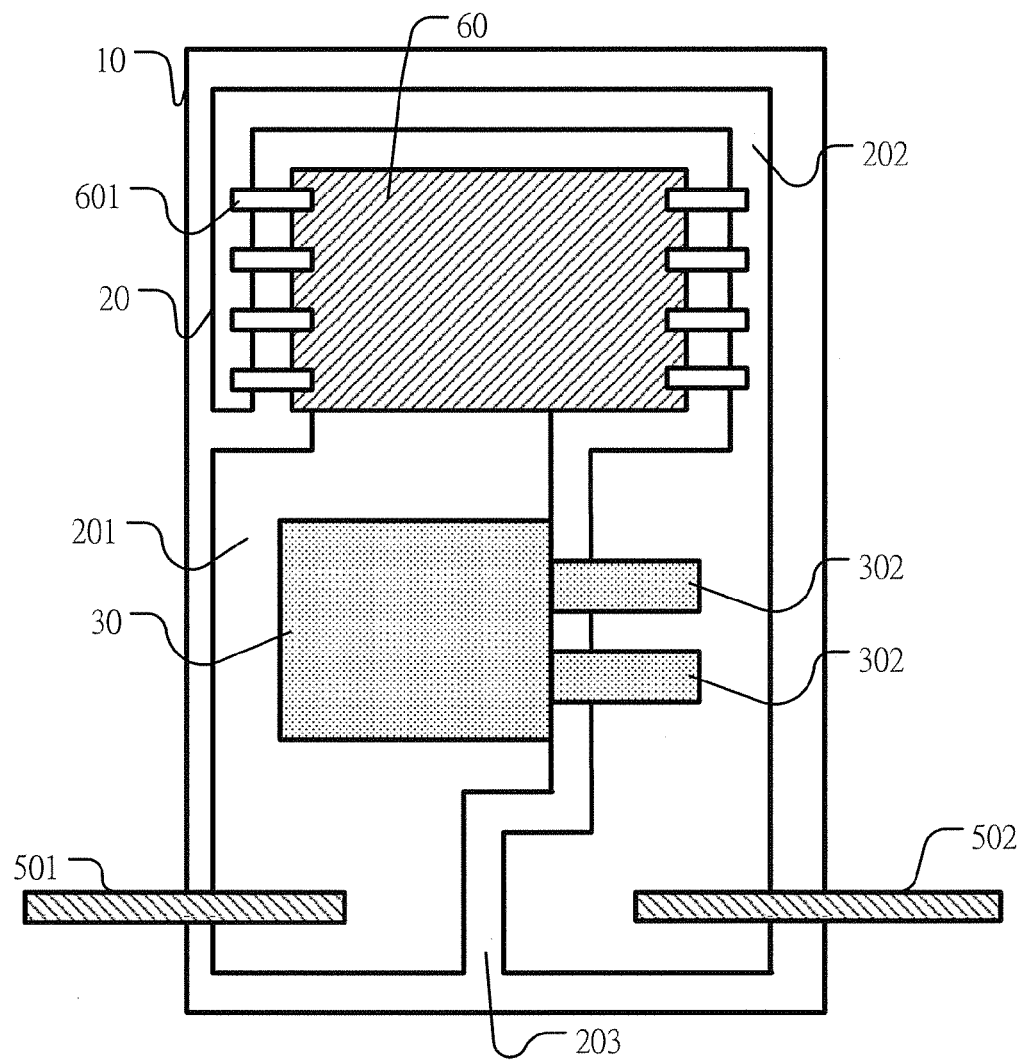
FIG. 1 shows a structural schematic diagram according to the prior art.

FIG. 1 shows the structure of the solar cell module according to the prior art. By comparing FIG. 1 and FIG. 2, it should be understood that the connection of the bypass diode 30 with the first and second wires 501, 502 changes significantly in the present invention.

Figure 3:
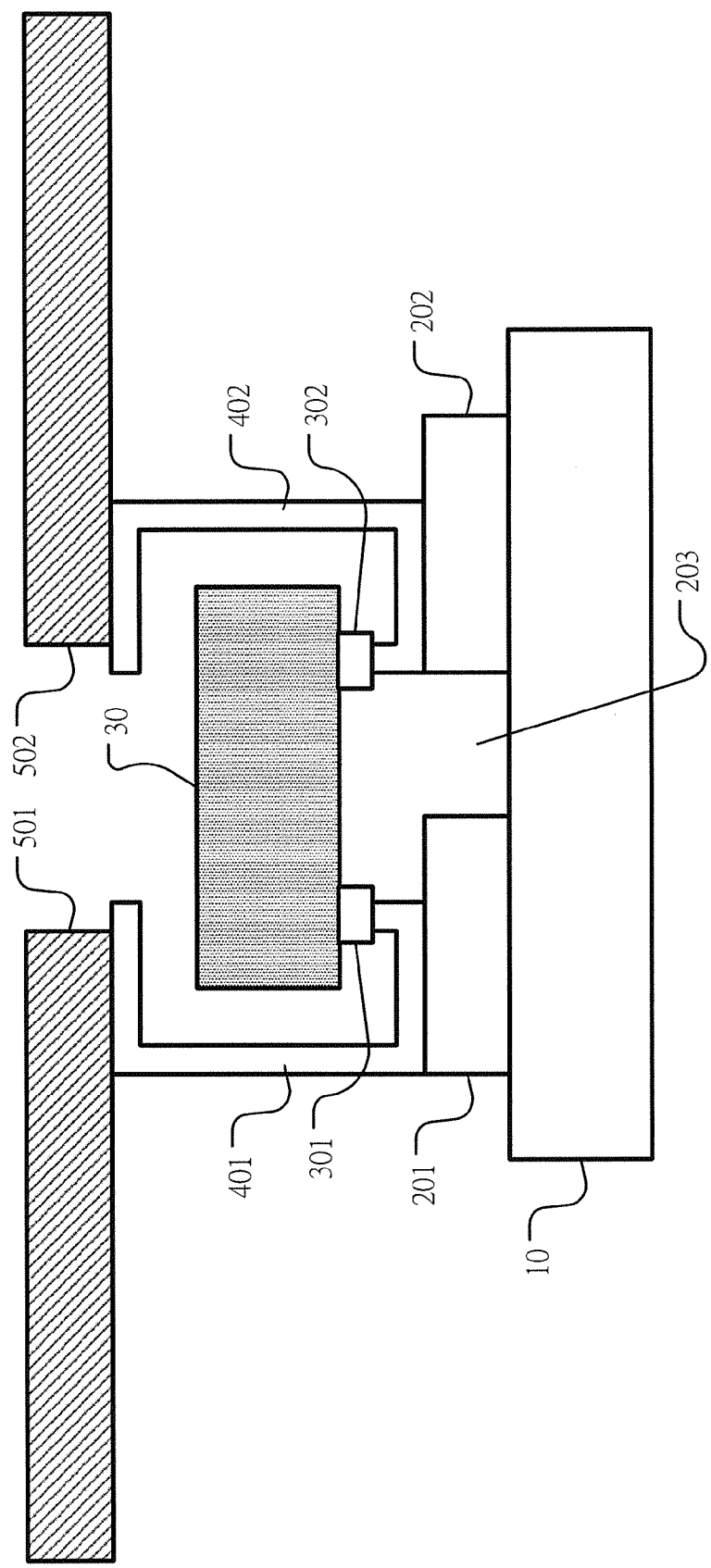
FIG. 3 shows a side view according to a preferred embodiment of the present invention.

Referring to FIG. 3, the relation between the bypass diode 30, the first conducting member 401, and the second conducting member 402 according to the present invention can be understood more clearly. In particular, in addition the connection described above, the first conducting member 401 is connected with the first pin 301 below the bypass diode 30, and then bends to the place above the bypass diode 30 by extending and going around the bulk of the bypass diode 30. The second conducting member 402 is connected with the second pin 302 below the bypass diode 30, and then bends to the place above the bypass diode 30 by extending and going around the bulk of the bypass diode 30. The extending directions of the first and second conducting members 401, 402 are along both sides of the corresponding bypass diode 30.

By the side view shown in FIG. 3, it is clear that the first conducting member 401 can contact the first wire 501 directly but not through the first metal conducting area 201. Likewise, the second conducting member 402 can contact the second wire 502 directly but not through the second metal conducting area 202.

In such a design, the required area of the substrate can be reduced substantially. The substrate adopted by modern solar cell modules is the ceramic substrate. The area of a 4-inch ceramic board is 110 mm×110 mm. The size of the current single ceramic substrate is 25 mm×15 mm. Thereby, a 4-inch ceramic board can be cut into 28 pieces of ceramic substrates. Nonetheless, if the apparatus combining bypass diode and wire according to the present invention is adopted, the ceramic substrate can be shrunk to 19 mm×15 mm, which means that a 4-inch ceramic board can be cut into 35 pieces of ceramic substrates, increasing the amount by ¼. Thereby, the manufacturing cost can be reduced remarkably.

Moreover, in addition to the connection among the first conducting member 401, the second conducting member 402, the first wire 501, and the second wire 502 as described above, the lengths of the first and second conducting members 401, 402 can be extended significantly for connecting to external devices within a certain distance without disposing the first or second wire 501, 502.

In addition to the electrical connection via contacting, the first and second conducting members 401, 402 can be designed to have an inset structure for further securing the connection when the wire is inset into the structure.

Figure 4:
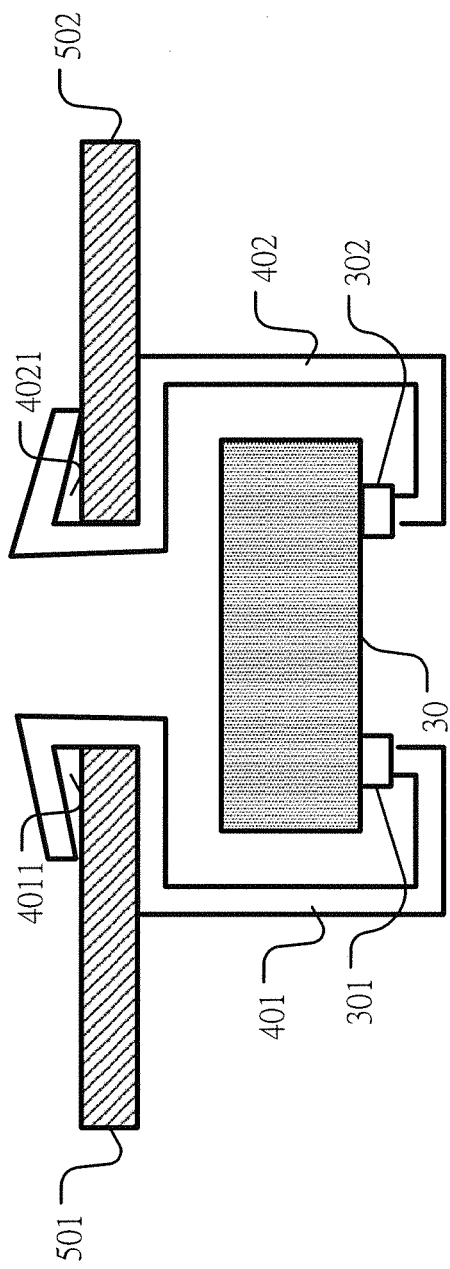
FIG. 4 shows a partial structural schematic diagram according to a preferred embodiment of the present invention.

Refer to FIG. 4 for the inset structure. In the bypass diode 30 and the related structures, the first conducting member 401 has a first inset opening 4011; the second conducting member 402 has a second inset opening 4021. The shapes of the first and second conducting members 401, 402 can be adjusted to form an indent having the clip-type design with the opening matching the wire. Thereby, the stability can be enhanced. As shown in FIG. 4, the first wire enters the first inset opening 4011 of the first conducting member 401 smoothly. By taking advantage of the matched size between the first inset opening 4011 and the first wire 501, the first wire 501 is hard to escape and thus contacting stably with the first conducting member 401 for current flows. Likewise, the second wire enters the second inset opening 4021 of the second conducting member 402 smoothly. By taking advantage of the matched size between the second inset opening 4021 and the second wire 502, the second wire 502 is hard to escape and thus contacting stably with the second conducting member 402 for current flows.

Figure 5:
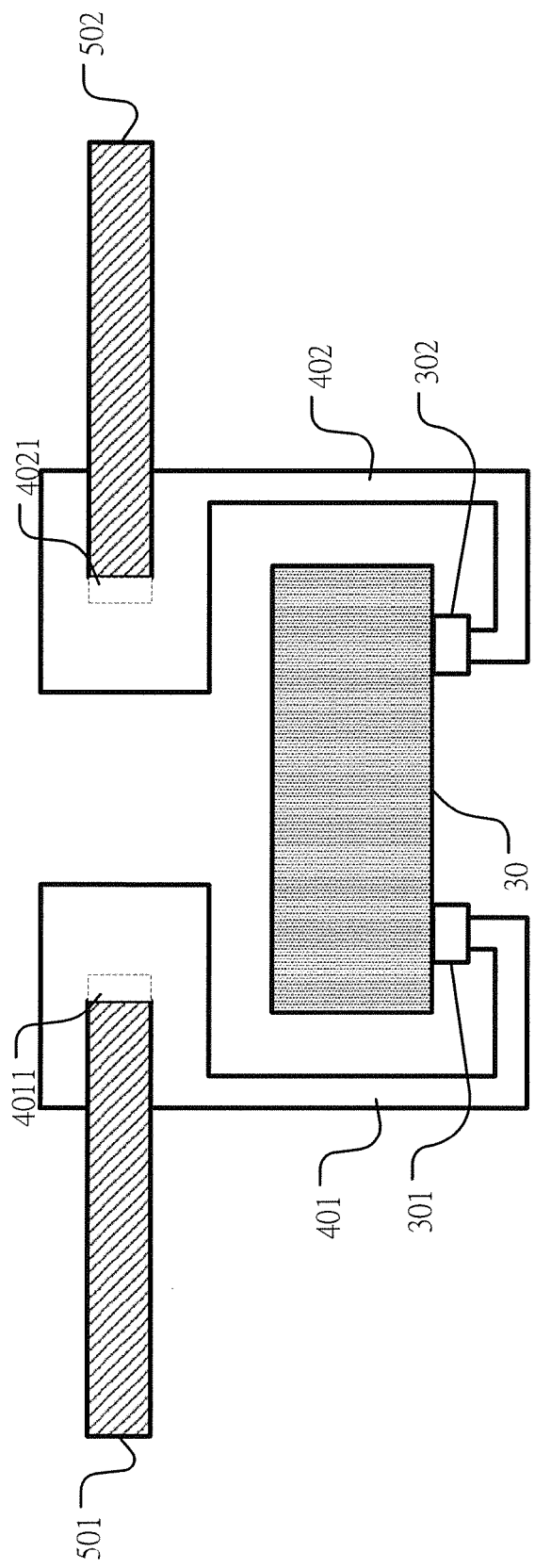
FIG. 5 shows a partial structural schematic diagram according to a preferred embodiment of the present invention.

Please refer to FIG. 5, which is also a kind of inset design for the first and second conducting members 401, 402. In this case, the first inset opening 4011 and the second inset opening 4021 seal all of the inserted wires tightly. This inserting-type inset is securer than the clip-type inset as described in FIG. 4. Thereby, it can provide superior and stable contact performance.

According to the apparatus combining bypass diode and wire, the current generated by the solar cell 60 can flow through the wire normally by passing the metal conducting layer 20 and the bypass diode 30 and using the electrodes of the apparatus itself along with the plurality of metal wires 601. Even when the hot-spot effect occurs, the bypass diode 30 can function to stabilize the circuit of the solar cell module. In addition to the basic function as described above, because the first and second conducting members 401, 402 can be integrated with the bypass diode 30, the area of the used substrate can be reduced substantially. Consequently, the average manufacturing cost is less and its commercial value is extremely high.

Accordingly, the present invention conforms to the legal requirements owing to its novelty, nonobviousness, and utility. However, the foregoing description is only embodiments of the present invention, not used to limit the scope and range of the present invention. Those equivalent changes or modifications made according to the shape, structure, feature, or spirit described in the claims of the present invention are included in the appended claims of the present invention.

The invention claimed is:

1. An apparatus combining bypass diode and wire, comprising:
   a substrate;
   a metal conducting layer, disposed on said substrate, having a first metal conducting area, a second metal conducting area, and an insulating area, and said insulating area separating said first metal conducting area and said second metal conducting area;
   a bypass diode, disposed above said metal conducting layer;
   a first conducting member, stacking and combining with a first pin of said bypass diode at said first metal conducting area; and
   a second conducting member, stacking and combining with a second pin of said bypass diode at said second metal conducting area.

2. The apparatus combining bypass diode and wire of claim 1, wherein said first conducting member extends from the underside of said first pin of said bypass diode to the above, and said second conducting member extends from the underside of said second pin of said bypass diode to the above.

3. The apparatus combining bypass diode and wire of claim 1, and further comprising at least a solar cell disposed on said first metal conducting area.

4. The apparatus combining bypass diode and wire of claim 3, and further comprising a plurality of metal wires connected electrically to said solar cell and said second metal conducting area.

5. The apparatus combining bypass diode and wire of claim 1, wherein said first conducting member further connects with a first wire.

6. The apparatus combining bypass diode and wire of claim 1, wherein said second conducting member further connects with a second wire.

7. The apparatus combining bypass diode and wire of claim 1, wherein said first conducting member has a first inset opening.

8. The apparatus combining bypass diode and wire of claim 1, wherein said second conducting member has a second inset opening.

* * * * *